United States Patent
Bollman

(10) Patent No.: US 7,310,053 B2
(45) Date of Patent: *Dec. 18, 2007

(54) COMPRESSED STANDARDIZED KEYBOARD

(76) Inventor: Taylor Bollman, 1800 Arapahoe St., Suite 2712, Denver, CO (US) 80202

( * ) Notice: Subject to any disclaimer, the term of this patent is extended or adjusted under 35 U.S.C. 154(b) by 0 days.

This patent is subject to a terminal disclaimer.

(21) Appl. No.: 11/243,953

(22) Filed: Oct. 4, 2005

(65) Prior Publication Data
US 2006/0028358 A1    Feb. 9, 2006

Related U.S. Application Data

(62) Division of application No. 10/446,416, filed on May 27, 2003, now Pat. No. 7,081,837.

(60) Provisional application No. 60/465,670, filed on Apr. 24, 2003.

(51) Int. Cl.
H03M 11/00    (2006.01)
(52) U.S. Cl. .................. 341/22; 400/489; 400/472; 715/810; 715/811; 704/9
(58) Field of Classification Search ........... 341/20, 341/22; 400/489, 472; 715/810, 811; 345/168, 345/169; 704/9
See application file for complete search history.

(56) References Cited

U.S. PATENT DOCUMENTS

| | | |
|---|---|---|
| 3,633,724 A | 1/1972 | Samuel |
| 3,945,482 A | 3/1976 | Einbinder |
| 4,555,193 A | 11/1985 | Stone |
| 4,579,470 A | 4/1986 | Casey |
| 4,778,295 A | 10/1988 | Bleuer |
| 4,824,268 A | 4/1989 | Diermisse |
| 4,846,598 A | 7/1989 | Livits |
| 4,847,799 A | 7/1989 | Morita et al. |
| 4,891,777 A | 1/1990 | Lapeyre |
| 5,017,030 A | 5/1991 | Crews |
| 5,186,555 A | 2/1993 | Chiba |
| RE34,304 E | 7/1993 | Goldwasser et al. |
| 5,288,158 A | 2/1994 | Matias |
| 5,317,647 A | 5/1994 | Pagallo |
| 5,367,298 A | 11/1994 | Axthelm |
| 5,493,654 A | 2/1996 | Gopher et al. |
| 5,514,866 A | 5/1996 | Retter |
| 5,664,896 A | 9/1997 | Blumberg |

(Continued)

FOREIGN PATENT DOCUMENTS

| | | |
|---|---|---|
| EP | 0 538 020 A1 | 4/1993 |
| EP | 1 575 069 A1 | 9/2005 |
| GB | 2 266 274 A | 10/1993 |
| JP | 2002-35857 | 2/2000 |

*Primary Examiner*—Albert K. Wong
(74) *Attorney, Agent, or Firm*—Gary D. Lueck; Vista IP Law Group LLP

(57) ABSTRACT

A keyboard of reduced size is provided in which multiple characters are assigned to each of the primary keys. The selection of the characters to be assigned to each specific primary key is based on the touch typing rules associated with a specific standardized keyboard, preferably allowing at least three rows of keys to be reduced to a single row of keys. A disambiguating system is used to interpret which of the characters and/or symbols assigned to a particular key is intended, typically by applying a set of disambiguating rules to generated input sequences.

53 Claims, 9 Drawing Sheets

U.S. PATENT DOCUMENTS

| | | |
|---|---|---|
| 5,790,103 A | 8/1998 | Wilner |
| 5,818,437 A | 10/1998 | Grover et al. |
| 5,841,374 A | 11/1998 | Abraham |
| 5,945,928 A | 8/1999 | Kushler et al. |
| 5,952,942 A | 9/1999 | Balakrishnan et al. |
| 5,973,621 A | 10/1999 | Levy |
| 6,011,554 A | 1/2000 | King et al. |
| 6,102,594 A | 8/2000 | Strom |
| 6,103,979 A | 8/2000 | Motoyama et al. |
| 6,170,000 B1 | 1/2001 | Bories et al. |
| 6,204,848 B1 | 3/2001 | Nowlan et al. |
| 6,262,717 B1 | 7/2001 | Donohue et al. |
| 6,286,064 B1 | 9/2001 | King et al. |
| 6,307,548 B1 | 10/2001 | Flinchem et al. |
| 6,307,549 B1 | 10/2001 | King et al. |
| 6,348,878 B1 | 2/2002 | Tsubai |
| 6,386,773 B1 | 5/2002 | Mathias |
| 6,407,679 B1 * | 6/2002 | Evans et al. ................... 341/20 |
| 6,520,699 B2 | 2/2003 | Abe |
| 6,525,676 B2 | 2/2003 | Kisaichi et al. |
| 6,731,227 B2 | 5/2004 | Horie |
| 6,885,317 B1 * | 4/2005 | Gutowitz ..................... 341/22 |
| 6,911,970 B2 | 6/2005 | Wen |
| 7,048,456 B2 * | 5/2006 | Keinonen et al. ........... 400/495 |
| 2001/0006587 A1 | 7/2001 | Keinonen et al. |
| 2002/0175057 A1 | 11/2002 | Swanson |
| 2003/0193478 A1 | 10/2003 | Ng et al. |
| 2004/0013457 A1 * | 1/2004 | Morris ....................... 400/489 |
| 2004/0190968 A1 | 9/2004 | Yang |
| 2004/0198249 A1 | 10/2004 | Griffin |
| 2005/0053225 A1 | 3/2005 | Griffin |
| 2005/0058492 A1 | 3/2005 | Hirsch |
| 2005/0123333 A1 | 6/2005 | Sugimura et al. |
| 2005/0184963 A1 | 8/2005 | Fyke |
| 2005/0244208 A1 | 11/2005 | Suess |
| 2005/0270183 A1 * | 12/2005 | Fux et al. ..................... 341/22 |
| 2005/0281604 A1 | 12/2005 | Choe et al. |
| 2005/0286953 A1 | 12/2005 | Griffin |
| 2006/0007120 A1 | 1/2006 | Fux et al. |
| 2006/0007128 A1 | 1/2006 | Fux et al. |
| 2006/0055669 A1 * | 3/2006 | Das ........................... 345/156 |
| 2006/0058995 A1 * | 3/2006 | Fux et al. ...................... 704/9 |
| 2006/0088356 A1 * | 4/2006 | Jawerth et al. ............. 400/472 |

* cited by examiner

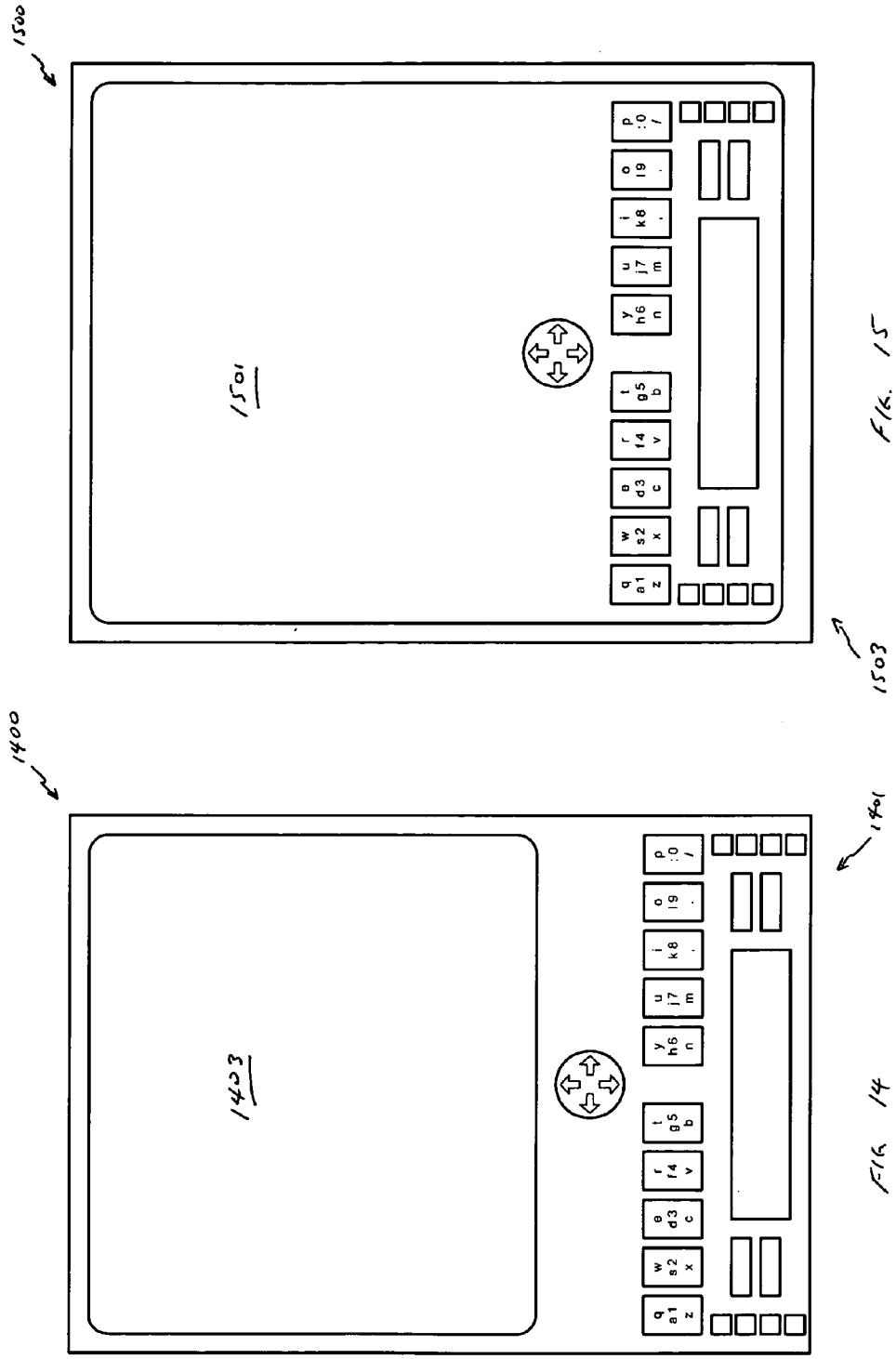

COMPRESSED STANDARDIZED KEYBOARD

CROSS-REFERENCES TO RELATED APPLICATIONS

This application is a divisional of application Ser. No. 10/446,416, filed May 27, 2003, now U.S. Pat. No. 7,081,837, issued on Jul. 25, 2006, priority of which is claimed under 35 U.S.C. § 120, which claims priority under 35 U.S.C. § 119 of Provisional Application No. 60/465,670, filed Apr. 24, 2003, the contents of which are incorporated herein by reference.

FIELD OF THE INVENTION

The present invention relates generally to input devices and, more particularly, to a method and apparatus for reducing the size of a keyboard while retaining the benefits associated with touch typing.

BACKGROUND OF THE INVENTION

In recent years, major advances have been made in reducing the size of various electronic devices such as personal computers and personal digital assistants (PDAs), these advances primarily being the result of processor, memory and/or display improvements. Miniaturization of the keyboard, however, has proven to be a significant limiting factor in achieving further size reductions.

Several approaches have been pursued in overcoming the size reduction limitations imposed by the keyboard. First, many small devices, especially PDAs, do not use an integrated keyboard and instead offer a very limited set of input means (e.g., a few keys, thumb pad, small touch screen, etc.). Devices of this sort do not allow the user to input text by typing. Second, some devices that do not include an integrated keyboard may allow the use of a detachable keyboard. Such keyboards may utilize either full size or reduced size keys and may be foldable to allow easy portability. Third, expandable keyboards have been incorporated into laptop computers, thus allowing them to be relatively portable while providing the user with a full size keyboard during use. Fourth, miniature keyboards have been incorporated into handheld devices, providing the user with a full set of keys based on a standardized layout. The primary drawback of such miniature keyboards is that the user, while holding the device in both hands, types using only their thumbs, thereby eliminating the possibility of touch typing.

An approach that has been used in a variety of ways is the use of a reduced set of keys. For example, U.S. Pat. No. 6,011,554 discloses a keyboard in which multiple characters are assigned to each key. The keyboard is coupled to a disambiguating system which interprets keystroke sequences and provides the user with a list of words that match the keystroke sequence in question, preferably ordering the list by frequency of use.

U.S. Pat. No. 6,348,878 discloses a keyboard in which a primary and a secondary letter is assigned to each key. Striking a key causes the primary letter to be generated unless a secondary function key is also struck. The patent discloses designating the most commonly used letters as primary letters. Additionally, common two letter combinations are placed on primary mode keys proximate to one another.

Although the prior art devices allow a reduction in keyboard size, they also reduce typing efficiency by preventing the user from utilizing standard touch typing skills. Accordingly, what is needed in the art is a method and apparatus that allows a user to retain the benefits associated with touch typing while still providing a dramatically reduced keyboard. The present invention provides such a method and apparatus.

SUMMARY OF THE INVENTION

The present invention provides a keyboard of reduced size that is based on a standardized keyboard layout, thus allowing a person to realize the benefits of touch typing with a keyboard that is a fraction of the size of a standard keyboard. In order to achieve the reduced size, multiple characters are assigned to each of the primary keys. The selection of the characters to be assigned to each specific primary key is based on the touch typing rules associated with the selected standardized keyboard and preferably reduces at least three rows of keys to a single row of keys. A disambiguating system is used to interpret which of the characters and/or symbols assigned to a particular key is intended, typically by applying a set of disambiguating rules to input sequences.

In accordance with one aspect of the invention, if the keyboard of the invention is to be based on a QWERTY standardized keyboard, a first primary key would be assigned the characters "q", "a" and "z", a second primary key would be assigned the characters "w", "s" and "x", a third primary key would be assigned the characters "e", "d" and "c", a fourth primary key would be assigned the characters "r", "f" and "v", a fifth primary key would be assigned the characters "t", "g" and "b", a sixth primary key would be assigned the characters "y", "h" and "n", a seventh primary key would be assigned the characters "u", "j" and "m", an eighth primary key would be assigned the characters "i" and "k", a ninth primary key would be assigned the characters "o" and "l", and a tenth primary key would be assigned the character "p".

In accordance with another aspect of the invention, if the keyboard of the invention is to be based on a DVORAK standardized keyboard, a first primary key would be assigned the character "a", a second primary key would be assigned the characters "o" and "q", a third primary key would be assigned the characters "e" and "j", a fourth primary key would be assigned the characters "p", "u" and "k", a fifth primary key would be assigned the characters "y", "i" and "x", a sixth primary key would be assigned the characters "f", "d" and "b", a seventh primary key would be assigned the characters "g", "h" and "m", an eighth primary key would be assigned the characters "c", "t" and "w", a ninth primary key would be assigned the characters "r", "n" and "v", and a tenth primary key would be assigned the characters "l", "s" and "z".

In accordance with yet another aspect of the invention, in addition to assigning multiple characters of the alphabet to each of the primary keys, numeric characters are assigned to the primary keys, thereby further reducing the overall size required for a 'complete' keyboard. Preferably a numbers lock or other form of shift key is used to designate the nature of the desired character.

In accordance with yet another aspect of the invention, one or more function, symbol and/or number keys are included in the keyboard. These keys can be assigned single or multiple meanings.

In accordance with yet another aspect of the invention, keyboard means are included that allow cursor position control. Such means include direction input keys (e.g., arrow keys), mouse pads, scroll wheels, and thumb pads.

The present invention can be used with a variety of different types of devices (e.g., PDAs, personal computers, etc.) and can be integrated into the device or used as an accessory. In the latter case, the keyboard can either be coupled wirelessly or via a wired connection. Additionally, the invented keyboard can use hard keys, soft keys, touch sensitive keys, etc.

In accordance with one aspect of the invention, the keyboard of the invention can be folded along a hinge line during non-use, thus providing a smaller overall size as well as means of protecting the keys, for example during transit. Alternately, portions of the keyboard can be designed to slide away from a central keyboard portion, thus providing comfortable hand positioning during use while minimizing space during non-use.

A further understanding of the nature and advantages of the present invention may be realized by reference to the remaining portions of the specification and the drawings.

BRIEF DESCRIPTION OF THE DRAWINGS

FIG. 8 is an illustration of a DVORAK-based keyboard utilizing primary and a secondary rows of keys as described relative to the keyboard shown in. FIG. 5;

FIG. 14 illustrates an embodiment in which the keyboard of the invention is integrated into a device's housing and mounted directly below the screen;

FIG. 15 illustrates an embodiment of the invention utilizing a device's touch sensitive screen;

DESCRIPTION OF THE SPECIFIC EMBODIMENTS

Overview

The present invention allows a user familiar with a specific keyboard layout, e.g., a QWERTY keyboard, to realize the benefits of touch typing while using a keyboard that is a fraction of the size of a standard keyboard. Due to the reduced size, the present keyboard can be conveniently used with various portable devices (e.g., portable or laptop computers, personal digital assistants or PDAs, etc.), thus providing a reduction in both the size and the weight of the combined device.

In a standard keyboard, to facilitate touch typing multiple keys are associated with each of the user's fingers, the keys being located in rows. Typically one row of keys is designated as the home or rest row while the other rows are located both above and below the home row. For example, in a QWERTY keyboard the fifth finger on the user's left hand rests on the "a" key. By contracting the finger slightly, the user is able to reach the "z" key. By extending the same finger slightly, the user is able to reach the "q" key. By extending the finger even more, the user is able to reach the "1" key.

In accordance with the present invention, multiple rows of keys on a standard keyboard are replaced with a single row of keys, each individual key representing multiple letters, symbols, numbers, etc. as described in detail below. In addition to the single row of keys, one or more auxiliary keys are preferably included in the keyboard of the invention.

Basic Keyboard Layout

Figure 1:
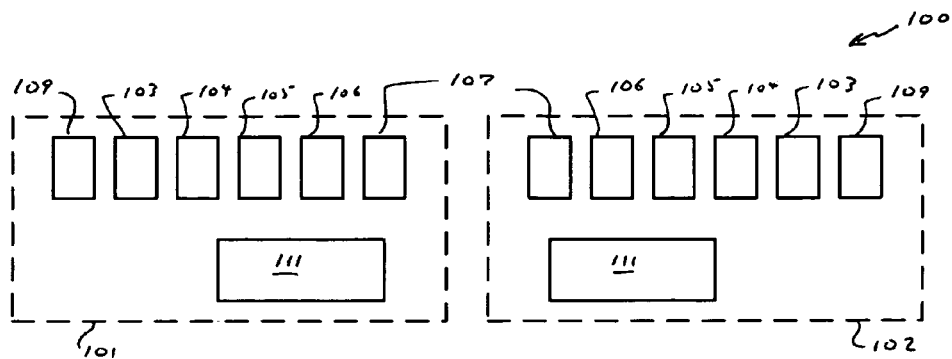
FIG. 1 is an illustration of a compressed keyboard according to a preferred embodiment of the invention.

FIG. 1 is an illustration of a compressed keyboard 100 according to a preferred embodiment of the invention. As shown, compressed keyboard 100 consists of two portions 101 and 102 corresponding to the user's left and right hands, respectively. As described in detail below, portions 101 and 102 may be fully independent of one another, thus allowing the user to position portions 101 and 102 in an ergonomically pleasing fashion. Alternately, portions 101 and 102 may be mounted to a singular keyboard support structure. Alternately, portions 101 and 102 may be mounted to an extendable structure, thus allowing the keyboard to be further minimized during periods of non-use. Alternately, portions 101 and 102 may be embedded within a device (e.g., PDA, cellular phone, portable computer, touch screen, etc.).

Portions 101 and 102 are each comprised of four primary or home keys 103-106. In the preferred embodiment, a fifth key 107 is included within each portion 101, 102, keys 107 adjacent to keys 106. During typing, although the rest position of the user's index fingers is on keys 106, a minor extension of the user's index fingers allow keys 107 to be reached. In another preferred embodiment, a sixth key 109 (or a fifth key 109 if the embodiment does not include keys 107) is located adjacent to keys 103. Minor extensions of the user's fifth fingers (i.e., little fingers) allow keys 109 to be reached. Preferably one or more auxiliary keys 111 are also located within one or both portions 101, 102. Keys 111 may be located for easy access by the user's thumbs. As described in detail below, auxiliary keys 111 are used to input functions such as shift, space, enter, etc.

Figure 2:
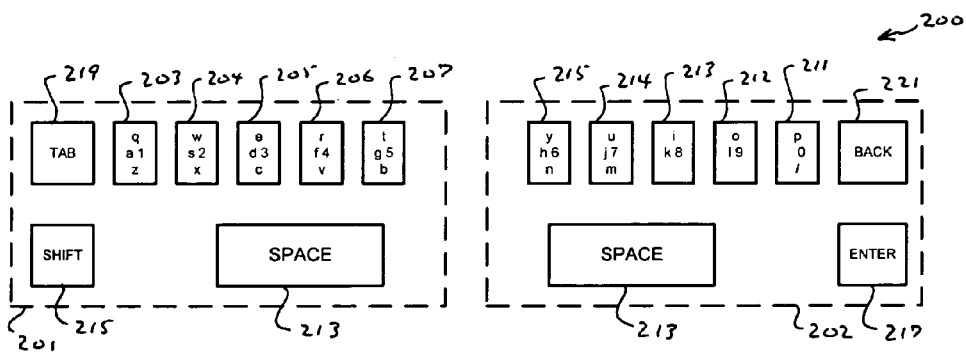
FIG. 2 is an illustration of a preferred embodiment of the invention in which the keyboard layout is based on a QWERTY keyboard.

FIG. 2 is an illustration of a preferred embodiment 200 of the invention in which the keyboard layout is based on a QWERTY keyboard. As shown, left hand portion 201 includes home keys 203-206 along with index finger extension key 207. Similarly, right hand portion 209 includes home keys 211-214 along with index finger extension key 215. Preferably the size and spacing of keys 203-207 and 211-215 are the same as in a standard QWERTY keyboard. As opposed to a traditional QWERTY layout, however, in which separate keys are used for each letter of the alphabet, numerals and some punctuation symbols, the keyboard of the present invention assigns multiple letters, numbers and/or punctuation symbols to each key. Thus, as shown in FIG. 2, key 203 can be used to input "q", "a", "z", or "l". As will be described in further detail below, a processor coupled to keyboard 200 determines which of these possible input values the typist probably intended.

It will be appreciated that although the QWERTY layout is quite specific as to the keyboard locations of the individual letters a-z as well as numbers 1-9 and 0, the positions of the various punctuation symbols is somewhat more fluid. For example, positions of many punctuation symbols may be dependent upon the intended user. Therefore although key 211 is shown with input values "p", ";", "?", "0", it will be appreciated that other punctuation symbols can be assigned to this key (e.g., "p", ";", "/", and "0").

Although keys 203-207 and 211-215 represent the primary input keys, it will be appreciated that it is advantageous to include other keys on the keyboard. Preferably the keyboard of the invention also includes one or more space keys 213, a shift key 215 and an enter key 217. In at least one embodiment of the invention, the keyboard also includes a tab key 219 and a back space key 221.

Figure 3:
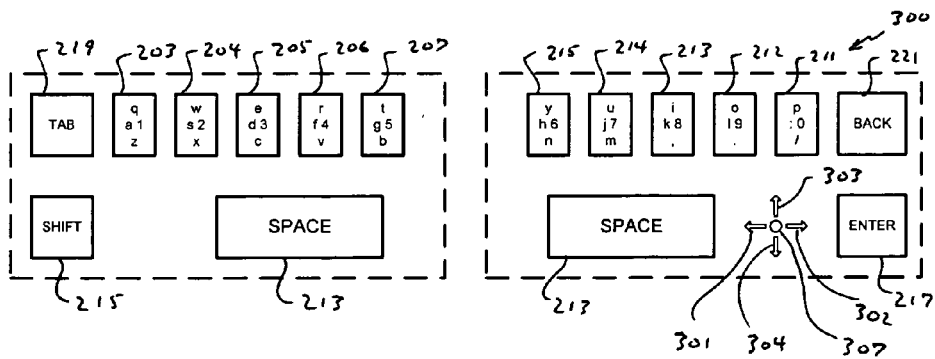
FIG. 3 is an illustration of another embodiment of the invention which includes cursor directional arrow keys.

FIG. 3 is an illustration of another embodiment of the invention. In addition to the keys shown relative to keyboard 200, keyboard 300 includes left arrow key 301, right arrow key 302, up arrow key 303 and down arrow key 304. It will be appreciated that similar functionality can be obtained with a 4- or 5-way thumb pad, mouse pad, scroll wheel or other multi-directional switching means. As described in further detail below, arrow keys 301-304 are used to alter positions within previously written text, for example as a means of identifying text to change, delete, etc.

In at least one embodiment of the invention, at least two of arrows 301-304 are used as a means of selecting special text for input. For example, the up arrow key 303 and down arrow key 304 can be used to scroll through a variety of available punctuation symbols in addition to those provided by keys 211-213 (e.g., ! @ # $ % ^ & * ( ) _ - + = [ ] { } \' " < > etc.). In at least one embodiment, left arrow key 301 and right arrow key 302 are used to select a symbol family. Example symbol families include grammatical symbols, mathematical symbols, Greek letters, etc. By breaking the total number of possible symbols into families, fewer symbols are included within each family, thus speeding up symbol selection. Once the desired symbol is located, it is preferably selected using enter key 217 or a similar symbol selection key. In order to add further versatility, preferably keyboard 300 includes a toggle key 307, for example mounted in the middle of the arrow keys as shown, that allows the user to toggle the functionality of arrow keys 301-304 (e.g., toggling between cursor positioning arrows and symbol selection arrows).

It should be appreciated that the primary design attribute of the present invention is the reduction of three rows of letter keys to a single row of letter keys in which each key is capable of inputting more than a single letter and in which the locations of the keys follow a standardized pattern (e.g., a QWERTY layout). As a consequence, a user that is familiar with the selected standardized keyboard layout can utilize the keyboard of the present invention without having to learn a new keyboard layout, thus allowing the user to immediately transition to the invented keyboard. Additionally, many users will realize higher typing speeds as they will no longer be required to extend and contract their fingers to reach keys that are in a row located either above or below the home row.

As the primary design attribute of the present invention is the reduction of three rows of letter keys to a single row of letter keys as previously noted, it will be appreciated that specific locations for many of the secondary keys (e.g., symbol keys, number keys, grammatical symbol keys, etc.) is not required. As noted above, secondary key information can be input via standard keys, mouse pads, thumb pads, scroll wheels, etc. which can be located anywhere on the invented keyboard. The primary design constraints on the secondary keys are user accessibility and maintaining a compact, overall keyboard design.

Figure 4:
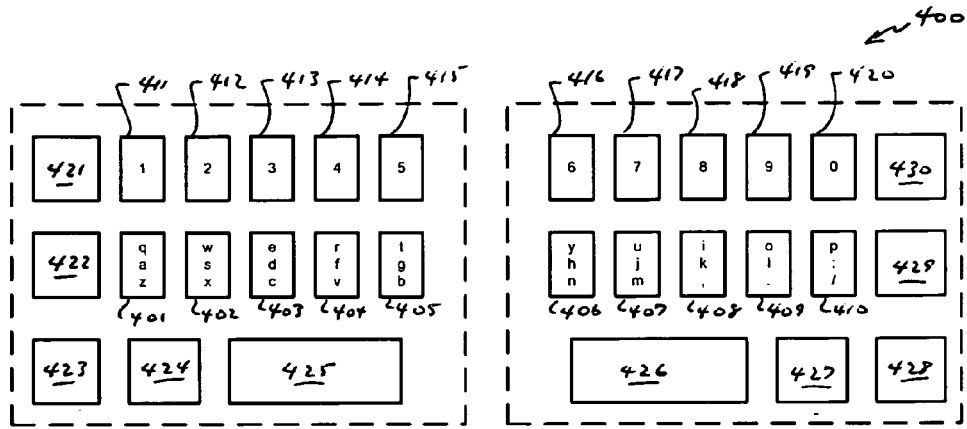
FIG. 4 illustrates a QWERTY-based keyboard embodiment in which the primary keys are limited to letters and a few grammatical symbols.
Figure 5:
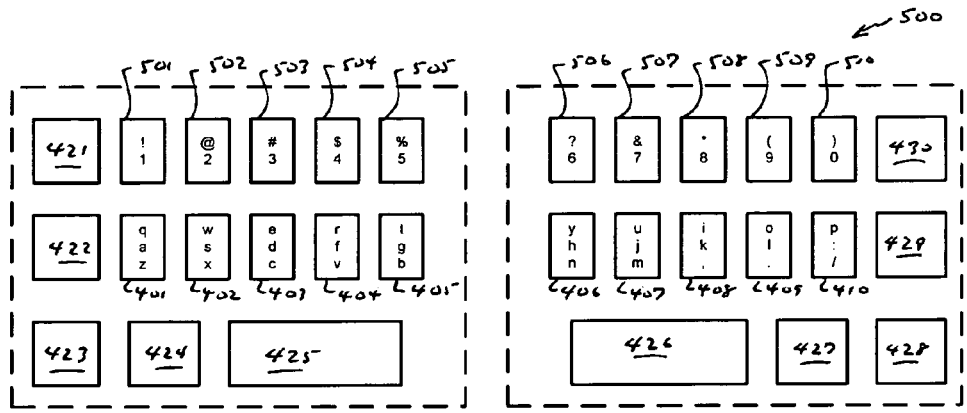
FIG. 5 illustrates a QWERTY-based keyboard embodiment similar to the embodiment shown in FIG. 4, the illustrated embodiment further including secondary keys suitable for inputting both numbers and a limited set of symbols.
Figure 6:
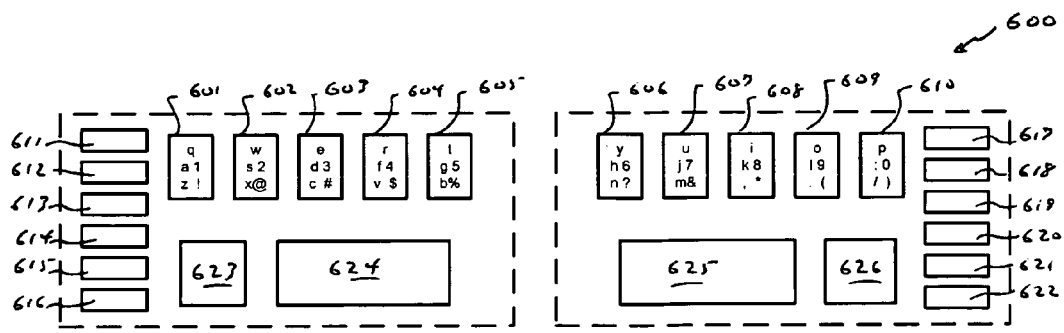
FIG. 6 illustrates a QWERTY-based keyboard embodiment with a secondary key arrangement different from that shown in FIGS. 4 and 5.

FIGS. 4-6 illustrate a few embodiments of the QWERTY-based keyboard of the present invention in which secondary keys are positioned in a variety of locations. It will be appreciated that these figures are only meant to illustrate the flexibility in locating secondary keys. The inventor clearly envisions other secondary key locations and these embodiments are not meant to be limiting.

FIG. 4 illustrates a QWERTY-based keyboard embodiment 400 in which primary keys 401-410 are limited to letters and a few grammatical symbols. An additional set of keys 411-420, positioned above the primary row of keys, are used to input numbers. Multiple secondary keys 421-430 are also included on the keyboard, these keys being assigned to such functions as space, back space, shift, tab, enter, control, alt, grammatical symbols, etc.

FIG. 5 illustrates a QWERTY-based keyboard embodiment 500 which has a keyboard layout similar to keyboard 400. As in keyboard 400, the keyboard includes primary keys 401-410, limited to letters and a few grammatical symbols, and multiple secondary keys 421-430. In keyboard 500, however, keys 501-510 are used to input both numbers and a limited set of symbols. Preferably the user selects whether to input a number or a symbol by using a shift key, preferably one of keys 421-430, and more preferably key 423 or key 428 or both.

FIG. 6 illustrates a QWERTY-based keyboard embodiment 600 in which primary keys 601-610 include the same characters as keys 401-410. Additionally, keys 601-610 include numeric characters 0-9, preferably accessed by striking the required primary key in combination with a secondary key such as a number lock key. Furthermore, keys 601-610 include many common grammatical symbols, preferably accessed by striking the required primary key in combination with a secondary key such as a control or function key. Keyboard 600 also includes multiple secondary keys 611-626. Preferably secondary keys are of different sizes, for example such as shown, thus allowing the user to easily select keys based on both location and size. For example, secondary keys 614 and 615 may be given the function of a space key, keys 613 and 616 may be given the functionality of shift and enter keys respectively, and keys 601-612 may be given the functionality of symbol keys, number lock key, control key, etc.

DVORAK Keyboard Layout

Figure 7:
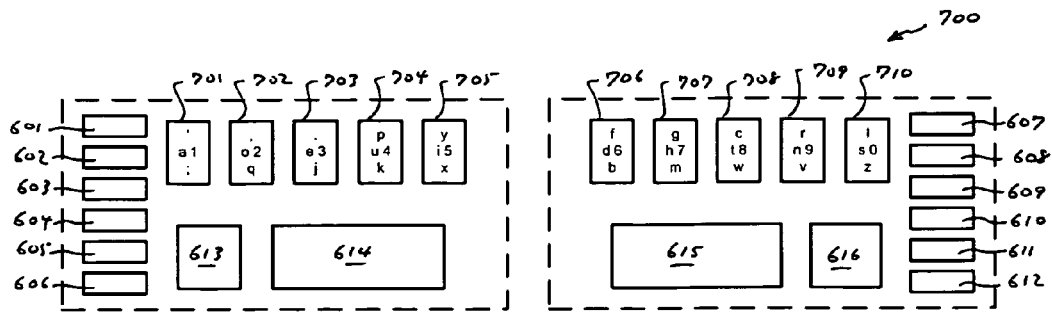
FIG. 7 is an illustration of a keyboard that is based on the DVORAK keyboard layout.
Figure 8:
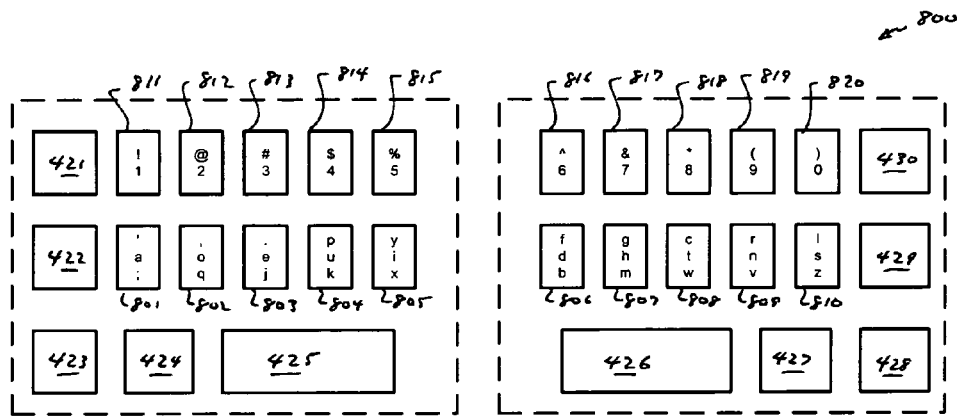

Although the principal intended application of the present invention is a keyboard based on the immensely popular QWERTY layout, it will be appreciated that the present invention can be used to replace other standardized keyboard layouts. For example, FIG. 7 is an illustration of a keyboard 700 that is based on the DVORAK layout. Although a keyboard layout similar to keyboard 600 is shown, it will be appreciated that, as previously described, the secondary keys can utilize other locations, sizes and quantities. The primary keys 201-207 and 211-215 of keyboard 600 are replaced in this embodiment with keys 701-710. Keys 701-710 match the key layout for a DVORAK keyboard except, as noted with respect to the previously described QWERTY-based keyboards, significantly reduce the number of keys by including the home keys, the row above the home keys, the row below the home keys and the numbers on a single row of keys. FIG. 8 is an illustration of a keyboard 800 that is based on the DVORAK layout but uses a primary and a secondary row of keys as described relative to keyboard 500. In this embodiment, keys 801-810 replace the three primary DVORAK rows of keys while keys 811-820 are used to input both numbers and a limited set of symbols. In this embodiment, multiple secondary keys 421-430 are also included on the keyboard, these keys being assigned to such functions as space, back space, shift, tab, enter, control, alt, grammatical symbols, etc. As previously noted, there are countless variations of secondary key sizes, quantities and locations that can be used with the invention.

Other Standardized Keyboard Layouts

As previously disclosed, the present invention is applicable to any standardized keyboard layout, thereby combining the benefits of fewer keys with a standardized keyboard layout. Although the applicability of the present invention has already been demonstrated with respect to both QWERTY and DVORAK standardized keyboards, two further examples are provided below. It will be appreciated that the present invention is not limited to these four standardized layouts; rather they are shown simply to illustrate the benefits and applicability of the invention.

Figure 9:
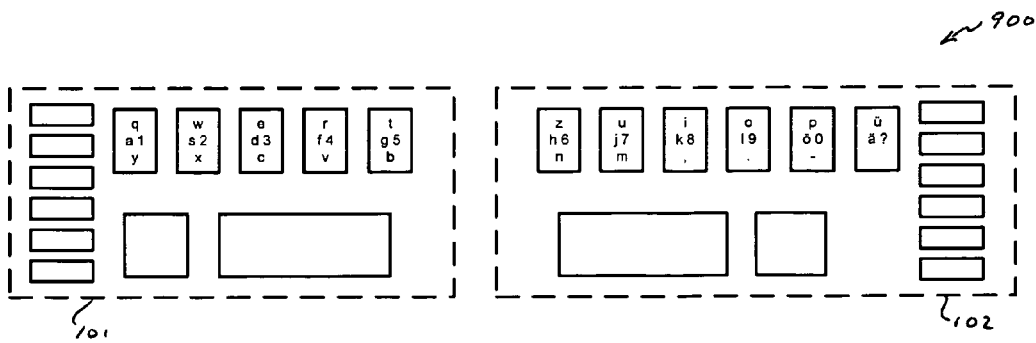
FIG. 9 illustrates a first embodiment of a keyboard based on the German standardized keyboard layout.
Figure 10:
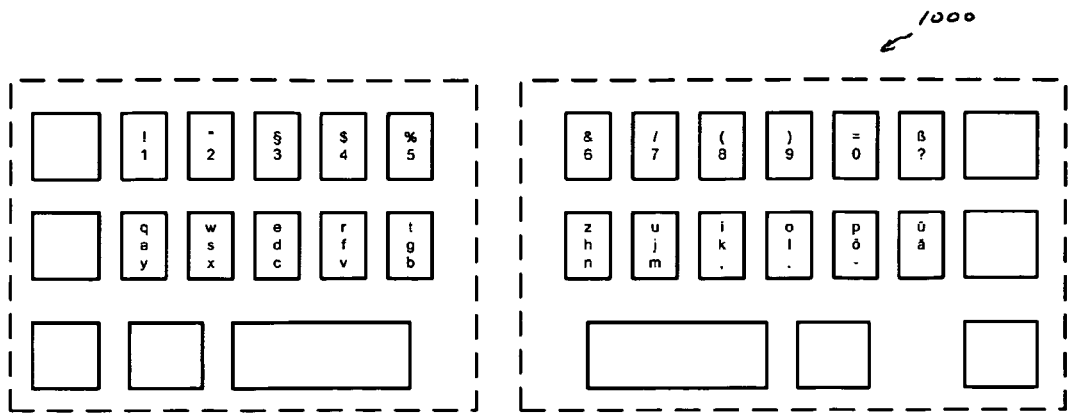
FIG. 10 illustrates a second embodiment of a keyboard based on the German standardized keyboard layout.
Figure 11:
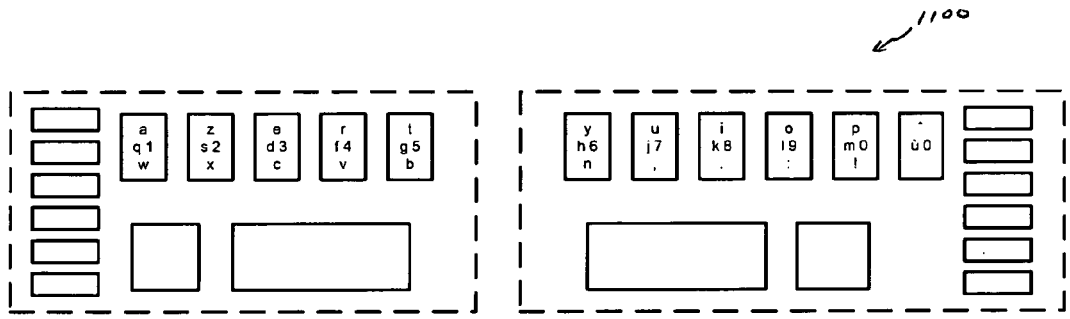
FIG. 11 illustrates a first embodiment of a keyboard based on the French standardized keyboard layout.
Figure 12:
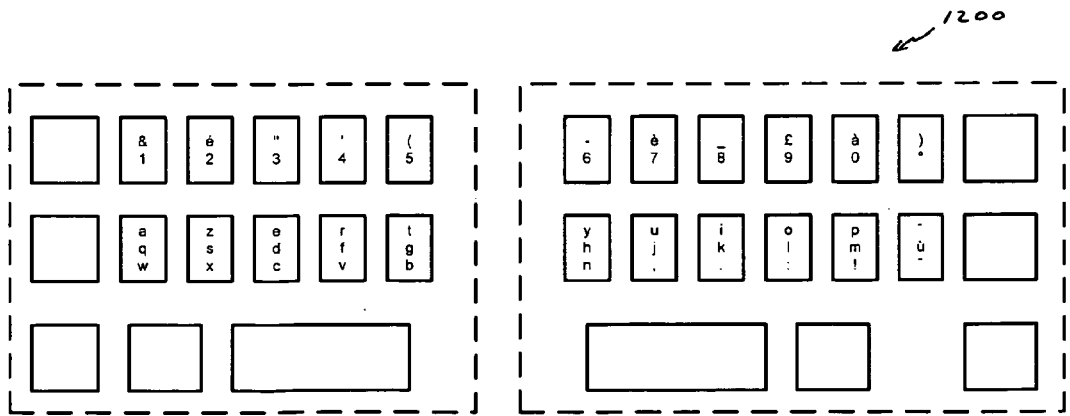
FIG. 12 illustrates a second embodiment of a keyboard based on the French standardized keyboard layout.

FIGS. 9 and 10 illustrate the application of the present invention to the German standardized keyboard layout while FIGS. 11 and 12 illustrate its applicability to the French standardized keyboard layout. FIGS. 9 and 11 utilize the basic configuration shown in embodiments 600 and 700 in which four rows of keys are reduced to a single row of keys. FIGS. 10 and 12 utilize the basic configuration shown in embodiments 500 and 800 in which three rows of keys are reduced to a single row of keys and a second row of keys, located above the first row of keys, is used to input numbers and a limited set of symbols. Due to the added complexity of the German and French standardized keyboards, right hand portions 102 in each of these layouts includes 6 primary keys rather than the 5 used in the QWERTY- and DVORAK-based layouts. As previously noted, there are countless variations of secondary key sizes, quantities and locations that can be used with the invention and those shown in FIGS. 9-12 are merely included for illustrative purposes.

Disambiguating System

As previously described in detail, the present invention assigns multiple letters, symbols and functions to keys, thus allowing a user familiar with a particular keyboard layout to utilize the present keyboard, albeit with many fewer keys. The preferred embodiment of the present invention relies on a disambiguating system to interpret user input.

Figure 13:
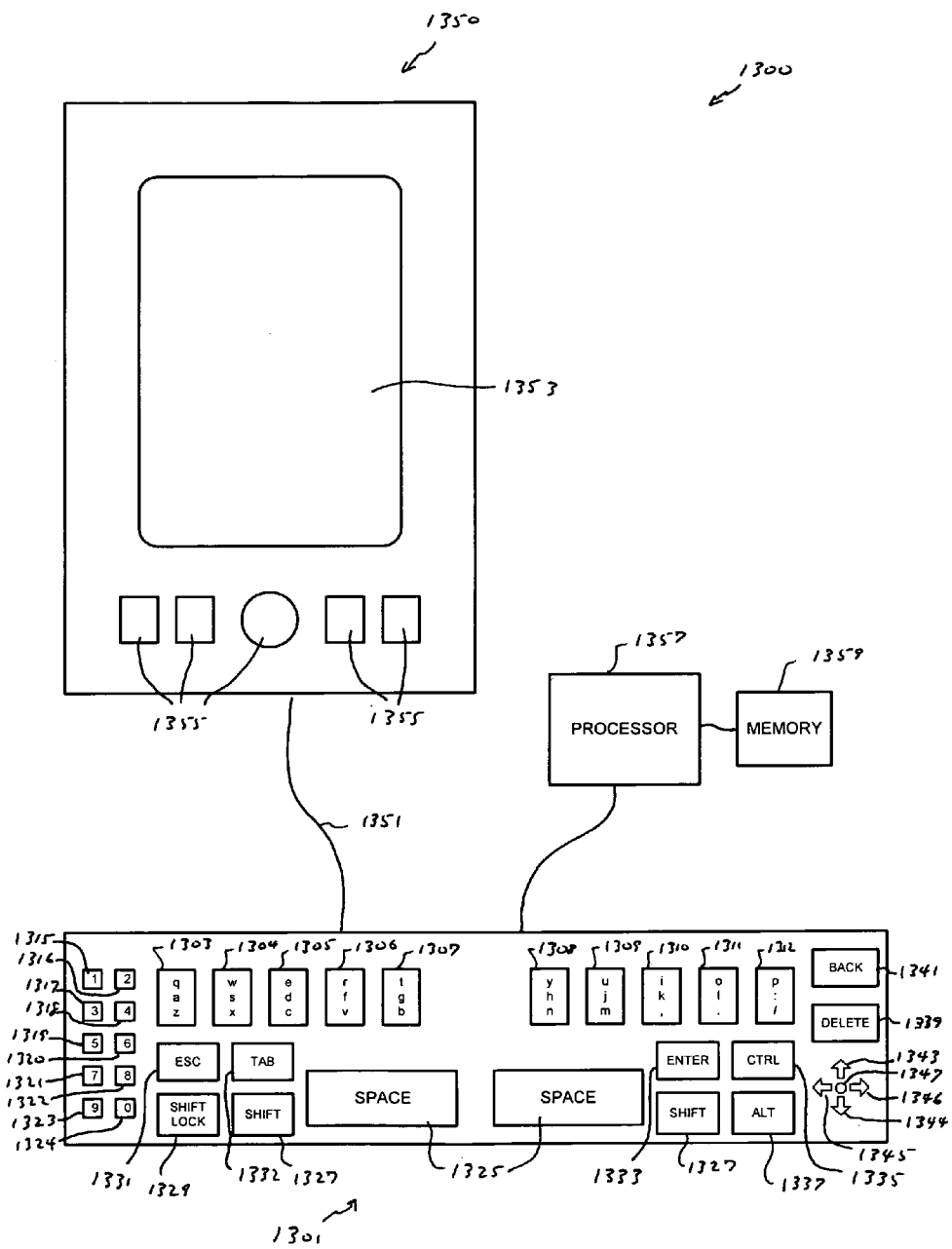
FIG. 13 is an illustration of a system utilizing a keyboard of the present invention.

FIG. 13 is an illustration of a system 1300 utilizing a keyboard 1301 of the present invention. Although system 1300 can use any of the keyboard embodiments discussed above, for purposes of illustration keyboard 1301 is a QWERTY-based keyboard. Primary keys 1303-1312 provide input means for the three primary QWERTY letter rows as shown. As previously noted, the present invention is not limited to a specific configuration of number keys, symbol keys and function keys. Accordingly, in this embodiment keyboard 1301 includes individual number keys 1315-1324, space keys 1325, shift keys 1327, shift lock key 1329, escape key 1331, tab key 1332, enter key 1333, control key 1335, alt key 1337, delete key 1339 and back space key 1341. Keyboard 1301 also includes up arrow 1343, down arrow 1344, left arrow 1345 and right arrow 1346. Preferably and as previously described, arrows 1343-1346 are used both for cursor movement and for symbol selection, key 1347 toggling between these two modes of operation.

Keyboard 1301 is coupled to a device 1350 via cable 1351. Cable 1351 may be a simple cable as shown or it may be included in a mechanical coupling device used to temporarily mount the keyboard to the device. As previously noted, device 1350 is any electronic device that may be beneficially combined with a keyboard. Typical devices include PDAs, personal computers (e.g., notebooks, sub-notebooks, handheld PCs and pocket PCs), etc. Device 1350 includes a display 1353 and one or more integrated input means 1355. Attached to keyboard 1301 are a processor 1357 and a memory 1359 which are used to disambiguate input from keyboard 1301. It will be appreciated that processor 1357 and/or memory 1359 may be coupled to keyboard 1301, integrated within keyboard 1301 or integrated within device 1350. As used herein, the term processor refers to processors, digital signal processors (DSPs), microprocessors, CPUs, application specific integrated circuits (ASICs), etc. while the term memory refers to non-volatile memory (e.g., ROM), volatile memory (e.g., RAM) or both.

A variety of techniques can be used to disambiguate input from keyboard 1301. In part, the technique employed may be selected on the basis of the capabilities of processor 1357 (e.g., speed, task dedication, etc.). The employed technique may also be selected on the basis of the size of memory 1359 since a larger memory, especially in conjunction with a faster processor, allows greater versatility in the application of the disambiguation system.

In general, processor 1357 in conjunction with memory 1359 applies a set of predefined rules to input received from keyboard 1301. For example, the system may review "words" as determined by the location of spaces and search a dictionary to determine possible words based on the specific keystrokes received from the keyboard. Thus if the disambiguating system receives a "word" that is comprised of the five key sequence; key 1303, key 1305, key 1307, key 1306 and key 1303, the system may conclude that the user was typing the word "zebra". If multiple words are available based on the keyed sequence, preferably the system applies a set of rules to determine which is the most likely word of the possible words. This set of rules can be based on grammatical rules (e.g., where in a sentence the word in question resides), the context of the word (e.g., reviewing one or more words before and/or after the word in question), the frequency of use in common language, etc.

As previously noted, the disambiguating system can base the selection of a term, in whole or in part, on a set of values that correspond to the frequency that each of the possible terms is used. Although such a set of values can be based on the common usage of each of the terms, this set of values can also be based on the frequency of use within a specific area (e.g., technical writing, legal writing, etc.).

In at least one embodiment, the disambiguating system is designed as a learning system, i.e., a system in which the values assigned for the frequency of use for each term are updated based on the actual frequency of use. Thus, for example, although the system may initially give a very low frequency value for a particular word, if the system observes that the use of the word in question is more frequent than initially assumed, the system will increase the frequency value assigned to the word.

In at least one embodiment, the user is able to alter the set of rules used to determine the likely match between a term and a set of key strokes. For example, the system can be set up to allow the user to assign weights of merit for each rule within a set of rules. Thus one user could set the system up to place the highest weight on the frequency of use values while another user could set the system up to place the highest weight on the location within a sentence for the word in question. In at least one embodiment the system is set up to allow the user to update the dictionary of terms used by the system. This system allows the user to compensate for a limited dictionary of terms, or to add unusual terms such as scientific terms of art.

In at least one embodiment of the invention, as the system disambiguates the user's input, it highlights those terms in which there are multiple possibilities. For example, an input sequence could be comprised of keys 1306, 1303 and 1308. Based on the set of rules applied, the system may have included the term "ran" within the typed section. By highlighting this term, the user is alerted to the fact that he or she may have intended a different word and other words are available. By selecting this word, for example by placing the cursor within the term and inputting a predefined key or sequence of keys (e.g., holding down key 1337 while striking key 1315), the user can be presented with the other possible terms for this input sequence (e.g., ray, rah, fan, van) from which to select. Selection can be by a variety of techniques such as highlighting the desired word and striking enter key 1333.

In at least one embodiment of the invention, the disambiguating system includes means for selecting the desired word when the system is unable to determine the desired word from a series of keystrokes, typically because the word in question is not included within the system's dictionary. The system may highlight the term in question or simply leave it as an unrecognizable series of keystrokes. Preferably the system allows the user to highlight each letter of the term in question and then select the desired letter from those available. For example, if the first letter of the term is based on the input from key 1303, the user would be allowed to select from the letters q, a and z. Preferably once the user has identified the proper term, the system either automatically inputs the term into its dictionary, or it allows the user the choice of whether or not to include the term in the system's dictionary.

Although a general description of disambiguating systems is provided above for purposes of clarity, it will be appreciated that there are countless variations of such systems and that the present invention is not limited to a single type of disambiguating system. Examples of disambiguating systems are described in U.S. Pat. Nos. 5,317,647, 5,664,896, 5,952,942, 6,011,554, and 6,307,549, the disclosures of which are incorporated herein in their entirety for any and all purposes.

In an alternative embodiment, rather than using a disambiguating system as disclosed above (or in combination with a disambiguating system), the user is able to select the desired character using a multi-tap approach as commonly used with cellular telephones. In such an approach the character to be entered is determined by the number of times a key is tapped. Thus, for example, with keyboard 1301 the user would tap key 1303 once if the character "q" is desired, twice if the character "a" is desired, and three times if the character "z" is desired. Although the user can be required to strike the "enter" key before starting to type the next character, preferably a character is entered as soon as the user strikes another key. Thus, for example, if the user wishes to type the word "an" with keyboard 1301, they would first strike key 1303 twice and then strike key 1308 three times. In such an embodiment, the system would either require the use of a special function key (e.g., enter key, etc.), a disambiguating system, or both, to take care of cases in which the same key must be used twice in succession. For example, the word "succession" requires that key 1305 be used three times in succession (i.e., "c", "c", "e") and key 1304 be used twice in succession (i.e., "s", "s").

Error Correction

The present invention can be used with any number of different error correction techniques, many of which are common, well known and used with a variety of standard keyboards and word processors. Therefore the following description is only intended to illustrate some of these techniques, not limit the invention to one or more particular techniques.

In at least one embodiment of the invention, as the user types possible errors are highlighted on the screen, for example using shading, underlining, different color text, etc. Typically system identified errors are those in which the disambiguating system was unable to determine a word matching the user input keystrokes. The user can go back at a later time (e.g., after completion of the document or a portion thereof) to correct the identified error.

In at least one embodiment of the invention, the user identifies previously written text to alter or correct by first moving a cursor to the desired location. Cursor movement is preferably controlled by arrow keys (e.g., keys 1343-1346 in keyboard embodiment 1301) or, similarly, up, down, right and left keys. As previously noted, other cursor movement techniques are also applicable, such as a keyboard mouse, thumb pad, scroll wheel, etc.

Preferably once a word to be altered or corrected has been identified, for example by double clicking, pressing "enter" or otherwise highlighting the word, the system provides a list of alternate words that match the previously input keystrokes. The user can then scroll through the list (e.g., using arrow keys) and pick the desired word to replace the system selected word. Alternately, the user can re-type the highlighted word, a technique that is useful both to correct typing errors as well as to select a different word. As with any word processing system, the user can move the cursor to a location in a previously written portion and either delete text or add new text.

Keyboard/Device Embodiments

Figure 16:
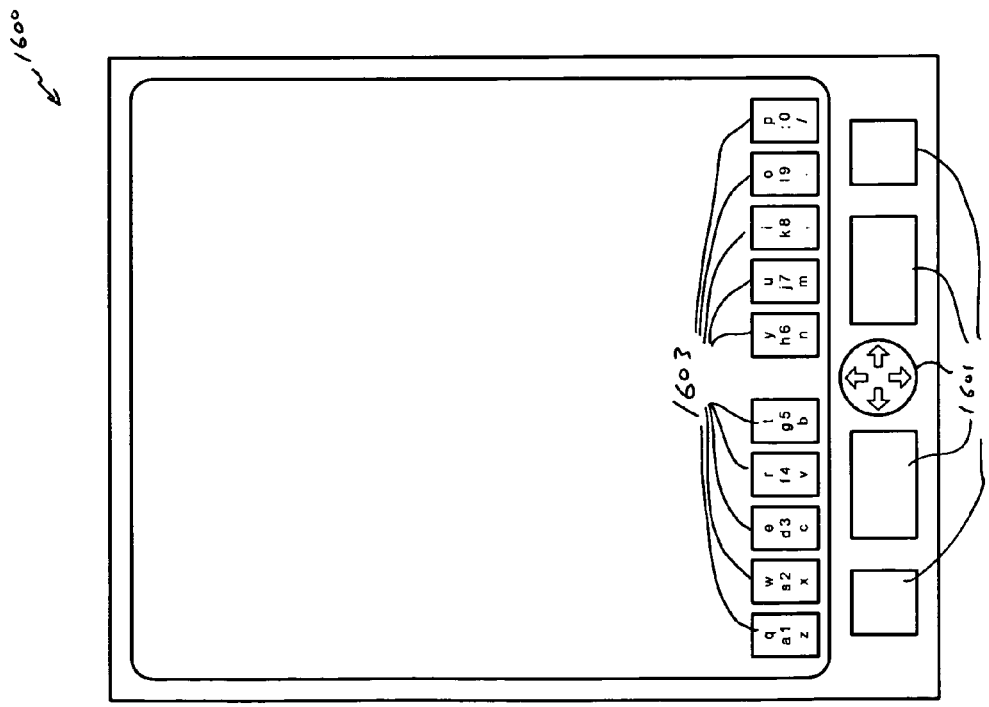
FIG. 16 illustrates an embodiment of the invention utilizing a combination of touch sensitive keys and hard keys.

The present invention can use either hard keys, i.e., those that physically move when depressed, or soft keys, i.e., those that do not move when selected. FIGS. 14-16 illustrate three embodiments in which the keyboard of the invention is integrated into a device such as a PDA or small computer (e.g., tablet or pocket PC). In embodiment 1400, keyboard 1401 is built into the device's housing and mounted directly below screen 1403. In embodiment 1500, screen 1501 is a touch sensitive screen, thus allowing the device to use a touch sensitive keyboard 1503 (shown for illustration purposes only with the same layout as keyboard 1401). In embodiment 1600, the system uses a combination of keys 1601 and touch sensitive keys 1603.

Figure 17:
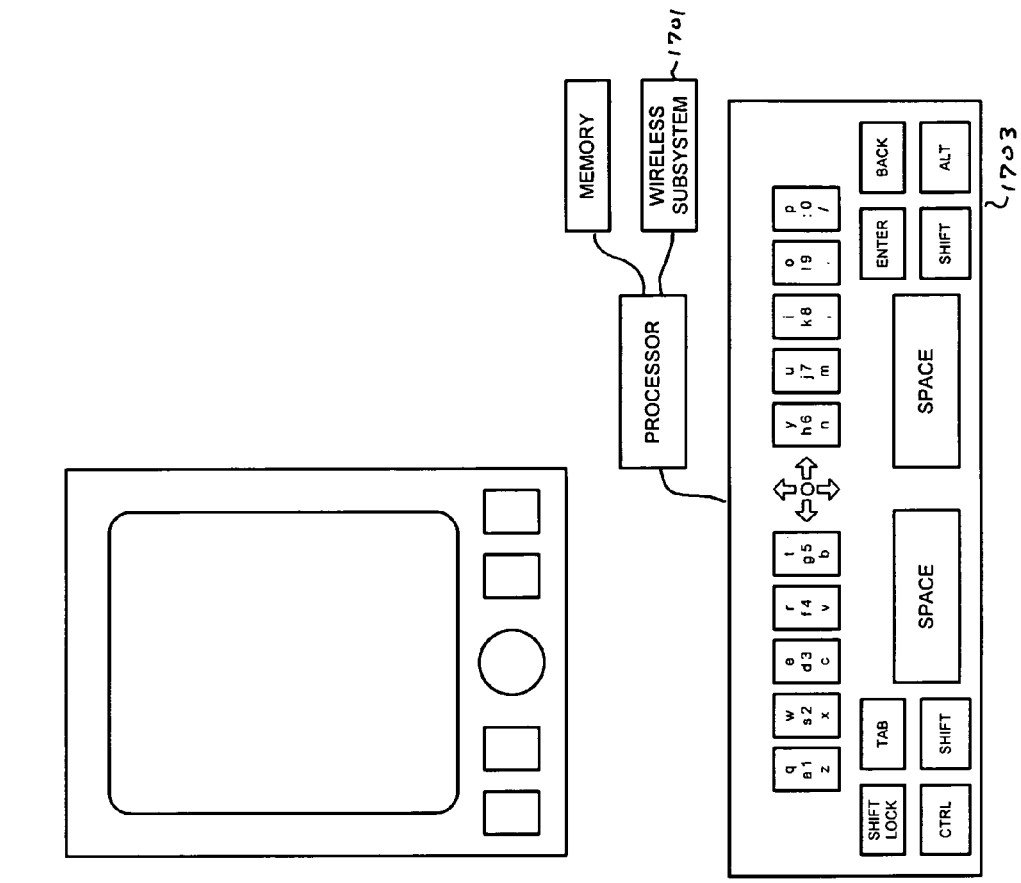
FIG. 17 is an illustration of a system utilizing a wireless keyboard.

As previously noted, the present invention can either be integrated into a device or be used as an accessory. In the latter case, the keyboard can either be wired to the intended device as illustrated in FIG. 13, or it can include a short range wireless networking subsystem 1701 as illustrated in FIG. 17. The use of a wireless subsystem allows keyboard 1703 to communicate with other correspondingly enabled devices and/or systems (e.g., computers, networks, etc.) that are within the subsystem's range. Typically the range of such a short range wireless networking subsystem is on the order of 30 feet or less although other ranges are possible (e.g., 100 feet or less, 500 feet or less, 1000 feet or less, etc.). The short range wireless networking subsystem includes a transceiver and can utilize any of a variety of networking technologies and protocols, as long as the selected system provides suitable networking capabilities between keyboard 1703 and the desired device or system. Examples of suitable technologies and standards include Bluetooth and IEEE802.11. As such technologies and standards are well know in the art (see, for example, the specifications found at www.bluetooth.com, www.standards.ieee.org/getieee802/802.11.html and www.grouper.ieee.org/groups/802/11/, all of which are incorporated herein by reference), further description will not be provided herein.

Figure 18:
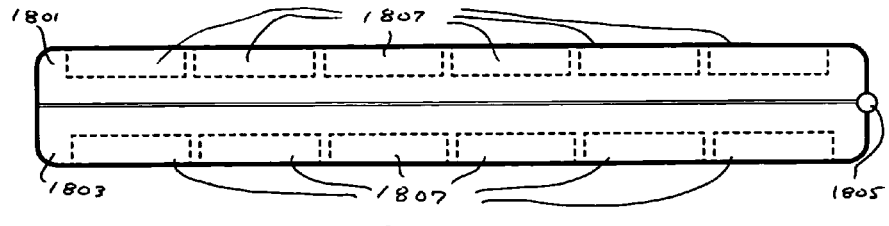
FIG. 18 is an illustration of a hinged keyboard.
Figure 19:
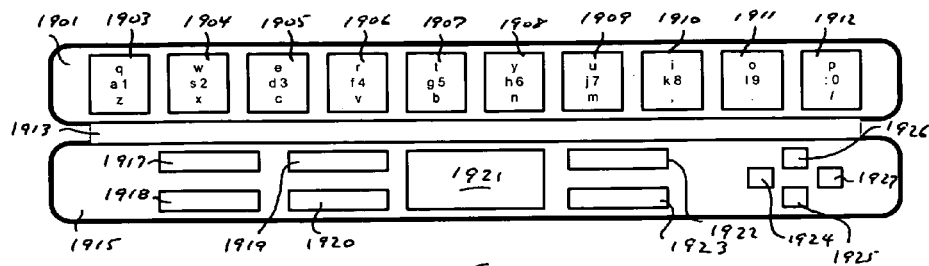
FIG. 19 is an illustration of an alternate embodiment of a hinged keyboard.

As previously noted, in some embodiments of the invention the keyboard is comprised of multiple pieces thus allowing the size of the keyboard to be further reduced when not in use. For example, the two keyboard portions identified with dotted lines in FIGS. 1-12 can be hingeably coupled together. Although the hinging mechanism can be designed to allow the back surfaces of the two keyboard portions to come into contact (or approximately thereof), preferably when the two keyboard portions are placed in the closed position, the keys come face to face, thus allowing the keyboard to act as its own carrying case as shown in FIG. 18. As shown, keyboard portions 1801 and 1803 are coupled via hinge member 1805. A cross-sectional view of keys 1807 contained within the closed keyboard is shown. Although preferably the hinge member is located between the two keyboard portions of FIGS. 1-12, it will be appreciated that it is possible to hinge the two portions together along the long axis. For example, as shown in FIG. 19, top portion 1901, which includes the primary keys 1903-1912, is coupled via hinge member 1913 to lower portion 1915 containing function keys 1917-1927.

Figure 20:
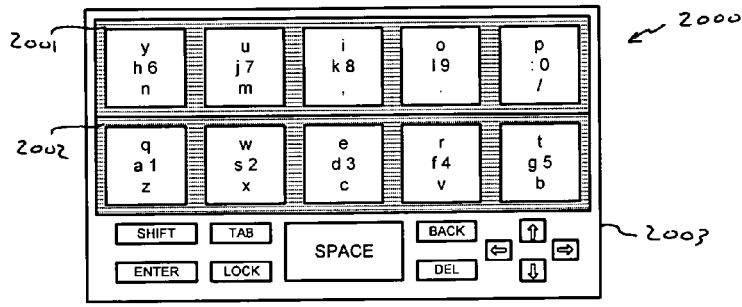
FIG. 20 is an illustration of a keyboard in which portions of the keyboard are slidably coupled to a base member.
Figure 21:
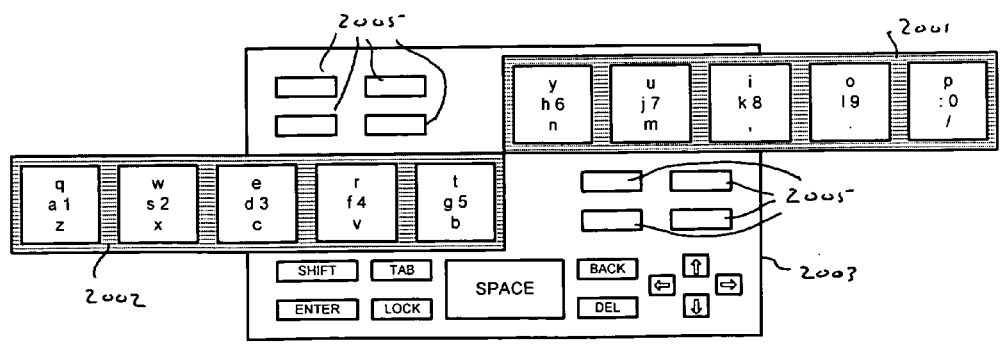
FIG. 21 is an illustration of the keyboard of FIG. 20 with the slidable portions extended.
Figure 22:
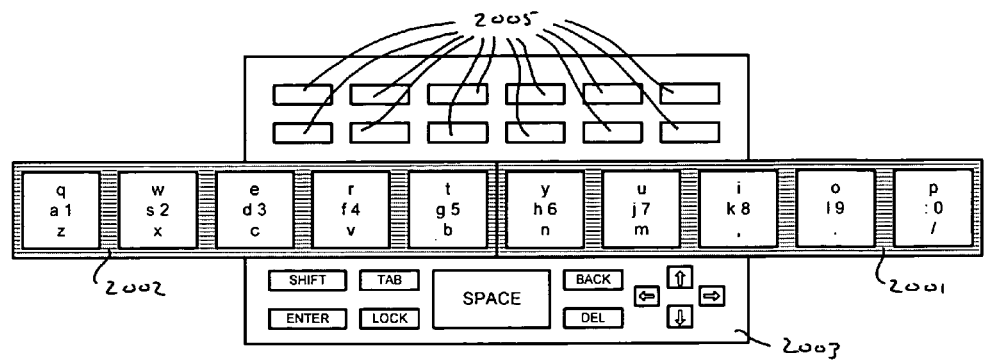
FIG. 22 is an illustration of the keyboard of FIG. 20 with the slidable portions extended and linearly aligned.

FIG. 20 is an illustration of a keyboard 2000 which includes at least one, and preferably at least two, slidable portions 2001 and 2002. When the user is ready to use keyboard 2002, portions 2001 and 2002 are slid out from the center of body portion 2003 as shown in FIG. 21, thus placing the hands in a more comfortable side-by-side position with one hand operating the keyboard at a slightly higher position than the other hand. Preferably additional function and/or symbol keys 2005 are located below portions 2001 and 2002, keys 2005 being accessible once the sliding portions are positioned for use as shown. Alternately, as shown in FIG. 22, when portions 2001 and 2002 are positioned for use, the final locations of these two portions can be moved into a line, thus providing complete side-by-side positioning.

Figure 23:
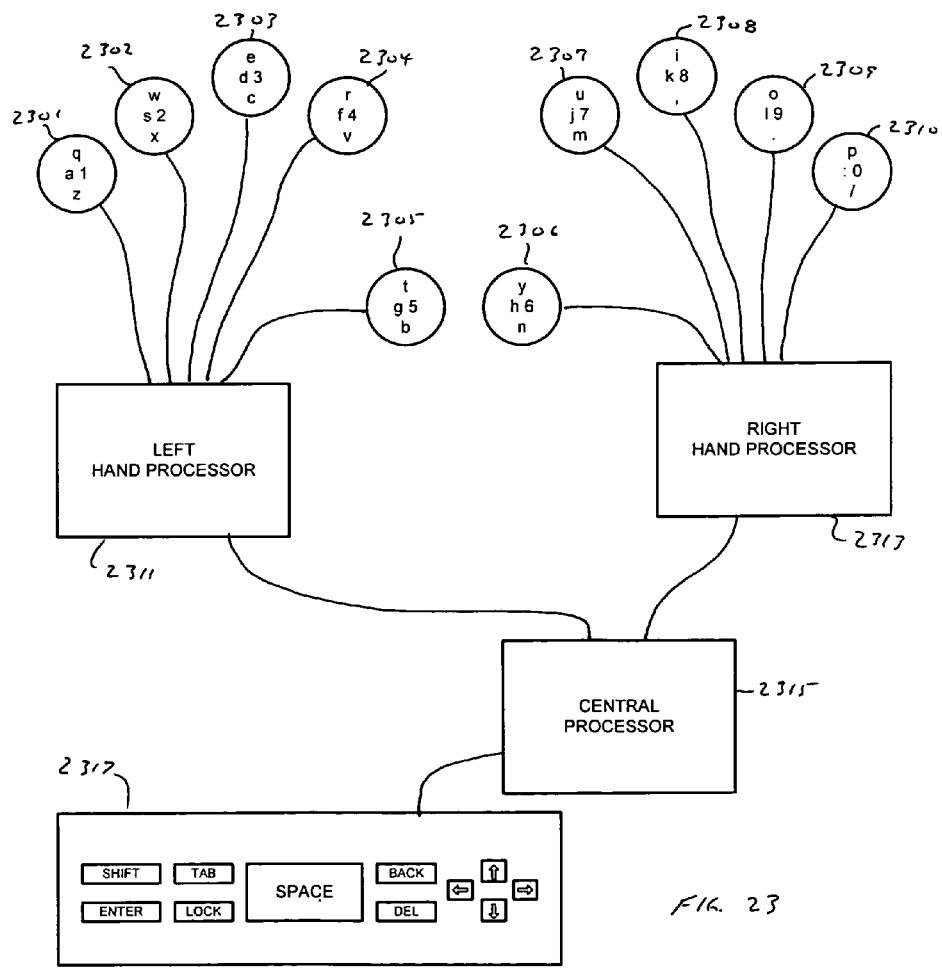
FIG. 23 is an illustration of an embodiment of the invention in which the keyboard is replaced with individual pressure sensitive keys.

FIG. 23 is an illustration of an embodiment of the invention in which the keyboard is replaced with individual pressure sensitive keys 2301-2310. Keys 2301-2310 are designed to be held onto the ends of the user's fingers, preferably either using a temporary adhesive or my mounting to the finger tips of a pair of gloves. As it is not possible to extend the index fingers of each hand to reach a second set of keys, preferably the key for the t, g and b inputs and the key for the y, h and n inputs are attached to the user's thumbs (i.e., keys 2305 and 2306, respectively). The left hand and right hand inputs are coupled to a left hand processor 2311 and a right hand processor 2313, respectively, which are then coupled to a central processor 2315. Alternately, the left and right hand inputs can be coupled directly to the central processor (not shown). The central processor can either be wired or wirelessly coupled to the intended device as described with respect to other embodiments of the invention.

In one embodiment of the system shown in FIG. 23, the individual finger keys do not include numbers and no additional input means is associated with the system. As such, only limited input is allowed. Preferably some combination of entries is used to signify spaces between words (e.g., double input of a specific key within a preset time, entry by two specific keys approximately at the same time, etc.).

In another embodiment of the system shown in FIG. 23, a set of keys 2317 is attached to central processor 2315 in addition to finger key inputs 2301-2310. Depending upon the desired configuration, keys 2317 can be used to input functions (e.g., space, enter, tab, cursor movement, etc.), grammatical symbols, numbers, etc. In order to prevent confusion between the input provided by a finger tip sensor and one of keys 2317, preferably processor 2315 disregards a finger tip sensor's input if it is input approximately simultaneously with the input from one of keys 2317. Certain exceptions to this rule include if the finger tip sensor input is simultaneous with the shift key input, thus indicating that the desired input is a capital letter. Similarly, if the finger tip sensor input is simultaneous with a number lock input (and assuming that keys 2301-2310 include numbers as shown in FIG. 23), the corresponding number would be generated.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A keyboard system, comprising:
a first portion having a first plurality of input keys and being configured for use by fingers of a user's left hand;
a second portion having a second plurality of input keys and being configured for use by fingers of a user's right hand,
wherein each of said plurality of input keys of the first and second portions corresponds to at least three individual keys on a standardized keyboard, is associated with a single, specific finger based on touch typing rules of the standardized keyboard and generates a signal when selected associated with each of said at least three individual keys, and wherein at least one portion is movable relative to the other portion;
a memory for storing a plurality of signal sequences, wherein each of said plurality of signal sequences is comprised of multiple signals generated by the selection of multiple input keys selected from said plurality of input keys; and
a processor coupled to said memory, said processor applying a set of disambiguating rules to each of said plurality of signal sequences and outputting a chosen signal sequence based on said set of disambiguating rules for each of said plurality of signal sequences.

2. The keyboard system of claim 1, wherein said standardized keyboard is a QWERTY keyboard.

3. The keyboard system of claim 1, wherein said standardized keyboard is a DVORAK keyboard.

4. The keyboard system of claim 1, wherein each of said first plurality of input keys and each of said second plurality of input keys corresponds to a numeral in addition to said at least three individual keys.

5. The keyboard system of claim 1, further comprising an input means for controlling a cursor position.

6. The keyboard system of claim 1, further comprising at least one function input key.

7. The keyboard system of claim 1, further comprising at least one grammatical symbol input key.

8. The keyboard system of claim 1, wherein the first and second portions are embedded within a portable device.

9. The keyboard system of claim 1, wherein the first portion includes at least five input keys and the second portion includes at least five input keys.

10. The keyboard system of claim 9, wherein
three letters and one numeral of the standardized keyboard are assigned to each input key of the first portion,
three letters and one numeral of the standardized keyboard are assigned to two input keys of the second portion,
two letters and one numeral of the standardized keyboard are assigned to two input keys of the second portion, and
one letter and one numeral of the standardized keyboard are assigned to one input key of the second portion.

11. The keyboard system of claim 9, wherein a grammatical symbol of the standardized keyboard is assigned to each of at least three input keys of the second portion.

12. The keyboard system of claim 9, wherein at least one letter, at least one numeral and at least one grammatical symbol of the standardized keyboard are assigned to at least three input keys of the second portion.

13. The keyboard system of claim 9, wherein the first portion includes five input keys, and three adjacent letters of three individual keys of three different rows of the standardized keyboard are assigned to each of the five input keys of the first portion.

14. The keyboard system of claim 9, wherein the second portion includes five input keys, and
three adjacent letters of three individual keys of three different rows of the standardized keyboard are assigned to first and second input keys of the second portion;
two adjacent letters of two individual keys of two different rows of the standardized keyboard are assigned to third and fourth input keys of the second portion; and
one letter of a key of the standardized keyboard is assigned to a fifth input key of the second portion.

15. The keyboard system of claim 14, wherein one numeral and one grammatical symbol of the standardized keyboard are also assigned to each of the third and fourth input keys of the second portion.

16. The keyboard system of claim 14, wherein one numeral and two grammatical symbols of the standardized keyboard are also assigned to the fifth input key of the second portion.

17. The keyboard of claim 9, wherein
a numeral of one key and three adjacent letters of three individual keys of three different rows of the standardized keyboard are assigned to each of the five input keys of the first portion,
a numeral of one key and three adjacent letters of three individual keys of three different rows of the standardized keyboard are assigned to first and second input keys of the five input keys of the second portion;
a numeral of one key and two adjacent letters of two individual keys of two different rows of the standardized keyboard are assigned to third and fourth input keys of the five input keys of the second portion; and
a numeral of one key and one letter of one key of the standardized keyboard are assigned to a fifth input key of the five input keys of the second portion.

18. The keyboard system of claim 17, wherein a grammatical symbol of the standardized keyboard is also assigned to the fourth input key of the second portion.

19. The keyboard system of claim 17, wherein two grammatical symbols of the standardized keyboard are also assigned to the fifth input key of the second portion.

20. The keyboard system of claim 1, wherein
the first portion includes a first space key corresponding to a space bar of the standardized keyboard and being configured for use by a user's left thumb, and
the second portion includes a second space input key corresponding to the space bar of the standardized keyboard and being configured for use by a user's right thumb.

21. The keyboard system of claim 1, wherein individual adjacent keys of the standardized keyboard that are accessible by extending and contracting a specific finger are combined into a single input key.

22. The keyboard system of claim 1, wherein all of the input keys to which at least one letter of the standardized keyboard is assigned are the same shape and size.

23. The keyboard system of claim 1, wherein individual "q", "a" and "z" keys on the standardized keyboard are combined into a single input key.

24. The keyboard system of claim 1, wherein individual "w", "s" and "x" keys on the standardized keyboard are combined into a single input key.

25. The keyboard system of claim 1, wherein individual "e", "d" and "c" keys on the standardized keyboard are combined into a single input key.

26. The keyboard system of claim 1, wherein individual "r", "f" and "v" keys on the standardized keyboard are combined into a single input key.

27. The keyboard system of claim 1, wherein individual "t", "g" and "b" keys on the standardized keyboard are combined into a single input key.

28. The keyboard system of claim 1, wherein individual "y", "h" and "n" keys on the standardized keyboard are combined into a single input key.

29. The keyboard system of claim 1, wherein individual "u", "j" and "m" keys on the standardized keyboard are combined into a single input key.

30. The keyboard system of claim 1, wherein individual "i", "k" and "," keys on the standardized keyboard are combined into a single input key.

31. The keyboard system of claim 1, wherein individual "o", "l" and "." keys on the standardized keyboard are combined into a single input key.

32. The keyboard system of claim 1, wherein individual "p", ":" and "/" keys on the standardized keyboard are combined into a single input key.

33. The keyboard system of claim 7, wherein the grammatical input key is an input key of the second portion.

34. A compressed standardized QWERTY keyboard system, comprising:
a plurality of input keys, wherein each of said plurality of input keys corresponds to at least three individual keys of a standardized QWERTY keyboard, the plurality of input keys being configured for use by a user's fingers, a first group of input keys being movable relative a second group of input keys, wherein each of said at least three individual keys is associated with a single, specific finger based on touch typing rules of the standardized QWERTY keyboard, and wherein each of said plurality of input keys generates a signal when selected associated with each of said at least three individual keys;
a memory for storing a plurality of signal sequences, wherein each of said plurality of signal sequences is comprised of multiple signals generated by the selection of multiple input keys selected from said plurality of input keys; and a processor coupled to said memory, said processor applying a set of disambiguating rules to each of said plurality of signal sequences and outputting a chosen signal sequence based on said set of disambiguating rules for each of said plurality of signal sequences.

35. The compressed standardized QWERTY keyboard system of claim 34, wherein
a first portion of a first plurality of input keys corresponds to a user's left hand, each key of the first portion being associated with a finger of the user's left hand for touch finger typing, and
a second portion having a second plurality of input keys corresponds to a user's right hand, each key of the second portion being associated with a finger of the user's right hand for finger touch typing.

36. A compressed standardized DVORAK keyboard system, comprising:
a plurality of input keys; wherein each of said plurality of input keys corresponds to at least three individual keys on a standardized DVORAK keyboard, the plurality of input keys being configured for use by a user's fingers, a first group of input keys being movable relative a second group of input keys, wherein each of said at least three individual keys is associated with a single, specific finger based on touch typing rules of the standardized DVORAK keyboard, and wherein each of said plurality of input keys generates a signal when selected associated with each of said at least three individual keys;
a memory for storing a plurality of signal sequences, wherein each of said plurality of signal sequences is comprised of multiple signals generated by the selection of multiple input keys selected from said plurality of input keys; and
a processor coupled to said memory, said processor applying a set of disambiguating rules to each of said plurality of signal sequences and outputting a chosen signal sequence based on said set of disambiguating rules for each of said plurality of signal sequences.

37. The compressed standardized DVORAK keyboard system of claim 36, wherein
a first portion of a first plurality of input keys corresponds to a user's left hand, each key of the first portion being associated with a finger of the user's left hand for touch typing, and
a second portion having a second plurality of input keys corresponds to a user's right hand, each key of the second portion being associated with a finger of the user's right hand for touch typing.

38. The keyboard system of claim 1, wherein the first and second portions of input keys are hingedly coupled.

39. The compressed standardized QWERTY keyboard system of claim 34, wherein the first and second groups of input keys are hingedly coupled.

40. The compressed standardized DVORAK keyboard system of claim 36, wherein the first and second groups of input keys are hingedly coupled.

41. The keyboard system of claim 1, wherein at least one portion of input keys is slidably movable relative to the other portion.

42. The keyboard system of claim 41, wherein both portions of input keys are slidably movable.

43. The keyboard system of claim 42, wherein the first portion of input keys is slidably movable in a first direction, and the second portion of input keys is slidably movable in a second, opposite direction.

44. The keyboard system of claim 43, wherein the first and second portions of input keys are horizontally slidably movable in opposite directions, and at least one portion of input keys is vertically slidably movable.

45. The keyboard system of claim 44, wherein the first and second portions of input keys are horizontally slidably movable, and at least one portion of input keys is vertically slidably movable to position the first and second portions of input keys in line.

46. The keyboard system of claim 1, further comprising at least one additional input key, wherein the at least one additional input key is accessible after at least one portion of input keys is slidably moved from a first position to a second position.

47. The compressed standardized QWERTY keyboard system of claim 34, wherein at least one group of input keys is slidably movable relative to the other group.

48. The compressed standardized QWERTY keyboard system of claim 47, wherein both groups of input keys are slidably movable.

49. The compressed standardized QWERTY keyboard system of claim 48, wherein the first group of input keys is slidably movable in a first direction, and the second group of input keys is slidably movable in a second, opposite direction.

50. The compressed standardized QWERTY keyboard system of claim 49, wherein the first and second groups of input keys are horizontally slidably movable in opposite directions, and at least one group of input keys is vertically slidably movable.

51. The compressed standardized QWERTY keyboard system of claim 50, wherein the first and second groups of input keys are horizontally slidably movable, and at least one group of input keys is vertically slidably movable to position the first and second portions of input keys in line.

52. The compressed standardized QWERTY keyboard system of claim 34, further comprising at least one additional input key, wherein the at least one additional input key is accessible after at least one group of input keys is slidably moved from a first position to a second position.

53. The keyboard system of claim 1, wherein at least three adjacent letters of at least three individual keys of three different rows of a standardized keyboard are assigned to each input key of the first portion.

* * * * *